(12) United States Patent
Wang et al.

(10) Patent No.: US 10,636,705 B1
(45) Date of Patent: Apr. 28, 2020

(54) HIGH PRESSURE ANNEALING OF METAL GATE STRUCTURES

(71) Applicant: Applied Materials, Inc., Santa Clara, CA (US)

(72) Inventors: Yifei Wang, Sunnyvale, CA (US); Kurtis Leschkies, San Jose, CA (US); Fei Wang, Fremont, CA (US); Xin Liu, Fremont, CA (US); Wei Tang, Santa Clara, CA (US); Yixiong Yang, San Jose, CA (US); Wenyi Liu, Santa Clara, CA (US); Ludovic Godet, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/204,560

(22) Filed: Nov. 29, 2018

(51) Int. Cl.
*H01L 21/768* (2006.01)
*H01L 21/02* (2006.01)
*H01L 21/28* (2006.01)

(52) U.S. Cl.
CPC .. *H01L 21/76882* (2013.01); *H01L 21/02244* (2013.01); *H01L 21/76846* (2013.01); *H01L 21/76883* (2013.01); *H01L 21/76888* (2013.01); *H01L 21/28079* (2013.01); *H01L 21/28088* (2013.01); *H01L 21/28097* (2013.01); *H01L 21/7685* (2013.01)

(58) Field of Classification Search
CPC ......... H01L 21/76864; H01L 21/76843; H01L 21/76846; H01L 21/76868; H01L 21/76873; H01L 21/76882
See application file for complete search history.

(56) References Cited

U.S. PATENT DOCUMENTS

| | | | |
|---|---|---|---|
| 6,099,904 A | 8/2000 | Mak et al. | |
| 6,156,382 A | 12/2000 | Rajagopalan et al. | |
| 6,162,715 A | 12/2000 | Mak et al. | |
| 6,206,967 B1 | 3/2001 | Mak et al. | |
| 6,249,055 B1 * | 6/2001 | Dubin | H01L 21/76831 257/751 |
| 6,251,190 B1 | 6/2001 | Mak et al. | |
| 6,309,713 B1 | 10/2001 | Mak et al. | |
| 6,528,409 B1 * | 3/2003 | Lopatin | H01L 21/288 257/E21.174 |
| 6,551,929 B1 | 4/2003 | Kori et al. | |
| 6,607,976 B2 | 8/2003 | Chen et al. | |
| 6,620,723 B1 | 9/2003 | Byun et al. | |
| 6,720,027 B2 | 4/2004 | Yang et al. | |
| 6,740,585 B2 | 5/2004 | Yoon et al. | |
| 6,809,026 B2 | 10/2004 | Yoon et al. | |
| 6,827,978 B2 | 12/2004 | Yoon et al. | |

(Continued)

*Primary Examiner* — Zandra V Smith
*Assistant Examiner* — John M Parker
(74) *Attorney, Agent, or Firm* — Patterson + Sheridan, LLP

(57) ABSTRACT

The method of treating a film stack includes depositing a barrier film containing a metal into a via formed within a dielectric layer disposed on a substrate and depositing a metal contact on the barrier film within the via, where a void is located within the barrier film or between the barrier film and the metal contact. The method also includes exposing the metal contact and the barrier film to an oxidizing agent at a temperature of less than 400° C. and at a pressure of about 20 bar to about 100 bar within a process chamber to produce a metal oxide within the void.

20 Claims, 2 Drawing Sheets

(56) References Cited

U.S. PATENT DOCUMENTS

| | | |
|---|---|---|
| 6,836,017 B2 * | 12/2004 | Ngo .................. H01L 21/76831 |
| | | 257/751 |
| 6,838,125 B2 | 1/2005 | Chung et al. |
| 6,849,545 B2 | 2/2005 | Mak et al. |
| 6,872,429 B1 | 3/2005 | Chen et al. |
| 6,875,271 B2 | 4/2005 | Glenn et al. |
| 6,936,538 B2 | 8/2005 | Byun |
| 6,939,801 B2 | 9/2005 | Chung et al. |
| 6,958,296 B2 | 10/2005 | Chen et al. |
| 7,026,238 B2 | 4/2006 | Xi et al. |
| 7,041,335 B2 | 5/2006 | Chung |
| 7,211,508 B2 | 5/2007 | Chung et al. |
| 7,244,683 B2 | 7/2007 | Chung et al. |
| 7,262,133 B2 | 8/2007 | Chen et al. |
| 7,504,006 B2 * | 3/2009 | Gopalraja ............. C23C 14/345 |
| | | 204/192.12 |
| 7,507,660 B2 | 3/2009 | Chen et al. |
| 7,541,650 B2 | 6/2009 | Hung et al. |
| 7,547,644 B2 | 6/2009 | Chen et al. |
| 7,576,002 B2 | 8/2009 | Chen et al. |
| 7,585,762 B2 | 9/2009 | Shah et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,691,742 B2 | 4/2010 | Marcadal et al. |
| 7,695,563 B2 | 4/2010 | Lu et al. |
| 7,709,385 B2 | 5/2010 | Xi et al. |
| 7,732,325 B2 | 6/2010 | Yang et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,824,743 B2 | 11/2010 | Lee et al. |
| 7,838,441 B2 | 11/2010 | Khandelwal et al. |
| 7,846,840 B2 | 12/2010 | Kori et al. |
| 7,867,896 B2 | 1/2011 | Cao et al. |
| 7,867,914 B2 | 1/2011 | Xi et al. |
| 7,892,602 B2 | 2/2011 | Chung et al. |
| 7,989,339 B2 | 8/2011 | Shah et al. |
| 8,653,663 B2 * | 2/2014 | Kao .................. H01L 23/53238 |
| | | 257/744 |
| 8,653,664 B2 * | 2/2014 | Liu .................... H01L 21/76831 |
| | | 257/751 |
| 2001/0016429 A1 | 8/2001 | Mak et al. |
| 2002/0086111 A1 | 7/2002 | Byun et al. |
| 2002/0117399 A1 | 8/2002 | Chen et al. |
| 2003/0049931 A1 | 3/2003 | Byun et al. |
| 2003/0057526 A1 | 3/2003 | Chung et al. |
| 2003/0059538 A1 | 3/2003 | Chung et al. |
| 2003/0072884 A1 | 4/2003 | Zhang et al. |
| 2003/0082307 A1 | 5/2003 | Chung et al. |
| 2003/0123216 A1 | 7/2003 | Yoon et al. |
| 2003/0124262 A1 | 7/2003 | Chen et al. |
| 2003/0157760 A1 | 8/2003 | Xi et al. |
| 2003/0194825 A1 | 10/2003 | Law et al. |
| 2003/0203616 A1 | 10/2003 | Chung et al. |
| 2003/0224217 A1 | 12/2003 | Byun et al. |
| 2004/0009336 A1 | 1/2004 | Marcadal et al. |
| 2004/0013803 A1 | 1/2004 | Chung et al. |
| 2004/0247788 A1 | 12/2004 | Fang et al. |
| 2006/0040052 A1 | 2/2006 | Fang et al. |
| 2007/0009658 A1 | 1/2007 | Yoo et al. |
| 2007/0026147 A1 | 2/2007 | Chen et al. |
| 2007/0099415 A1 | 5/2007 | Chen et al. |
| 2008/0206987 A1 | 8/2008 | Gelatos et al. |
| 2009/0085173 A1 * | 4/2009 | Boemmels ........ H01L 21/76814 |
| | | 257/635 |
| 2010/0062149 A1 | 3/2010 | Ma et al. |
| 2010/0062614 A1 | 3/2010 | Ma et al. |
| 2010/0075494 A1 | 3/2010 | Chung et al. |
| 2010/0075499 A1 | 3/2010 | Olsen |
| 2010/0102417 A1 | 4/2010 | Ganguli et al. |
| 2010/0120245 A1 | 5/2010 | Tjandra et al. |
| 2010/0167527 A1 | 7/2010 | Wu et al. |
| 2010/0311237 A1 | 12/2010 | Seutter et al. |
| 2011/0244682 A1 | 10/2011 | Khandelwal et al. |
| 2011/0256715 A1 * | 10/2011 | Pan .................. H01L 21/76831 |
| | | 438/653 |
| 2011/0266676 A1 * | 11/2011 | Isobayashi ........ H01L 21/76831 |
| | | 257/751 |

\* cited by examiner

HIGH PRESSURE ANNEALING OF METAL GATE STRUCTURES

BACKGROUND

Field

Embodiments described herein generally relate to methods for processing substrates, and more specifically to methods for reducing or eliminating gaps or voids within a film stack.

Description of the Related Art

In advanced semiconductor devices, the film stack structures have become smaller and more complicated than previous generations of semiconductor devices. For these advanced semiconductor devices with high aspect ratio trenches, it is quite a challenge to fill the desired materials (e.g., TiN) into such trenches without any voids or seams by conventional technologies (e.g., vapor deposition—including CVD and ALD), because the trench will be closed before completely filling. Such voids or gaps can damage the device performance significantly.

Currently, no mature technologies achieve void-free, high-aspect-ratio trenches efficiently and cost-effectively. The methods of tuning various vapor deposition recipes are unable to provide perfectly void-free trench filling when manufacturing film stacks. An alternative method is to open up the voids via etch and subsequently deposit material into the voids. However, the etching process can damage the device. Also, such method requires many steps and is not cost-effective. Other methods, such as materials reflow, are limited by the process thermal budgets.

Thus, there is a need for improved methods for reducing or eliminating gaps or voids within a film stack.

SUMMARY

In one or more embodiments, a method of treating a film stack, such as in a metal gate structure, includes depositing a barrier film containing a metal into a via formed within a dielectric layer disposed on a substrate and depositing a metal contact on the barrier film within the via, where a void is located within the barrier film or between the barrier film and the metal contact. The method also includes exposing the metal contact and the barrier film to an oxidizing agent at a temperature of less than 400° C. and at a pressure of about 20 bar to about 100 bar within a process chamber to produce a metal oxide within the void.

In some embodiments, a method of treating a film stack includes depositing a barrier film containing a metal into a via located on a substrate and depositing a metal contact on the barrier film within the via, where a void is located within the barrier film or between the barrier film and the metal contact. The method also includes exposing the metal contact and the barrier film to an oxidizing agent at a temperature of less than 400° C. and at a pressure of about 20 bar to about 100 bar within a process chamber to produce a metal oxide within the void, and then exposing the metal contact and the barrier film to an annealing gas a temperature of less than 400° C. and at a pressure of about 20 bar to about 100 bar within the process chamber, where the annealing gas can be or include nitrogen gas ($N_2$), ammonia, hydrogen gas ($H_2$), or a mixture thereof. In some examples, the void is disposed between two layers contained in the barrier film.

In other embodiments, a method of treating a film stack includes depositing a barrier film containing a metal into a via formed within a dielectric layer disposed on a substrate, where the void is disposed within the barrier film. The method also includes exposing the barrier film to an oxidizing agent at a temperature of less than 400° C. and at a pressure of about 20 bar to about 100 bar within a process chamber to produce a metal oxide within the void. The oxidizing agent can be or include water, steam, oxygen gas ($O_2$), oxygen plasma, ozone, hydrogen peroxide, or any combination thereof. The method further includes filling the void with the metal oxide to produce a sealed seam within the film stack.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods for reducing or eliminating open seams, gaps, or voids within a film stack, such as a metal gate structure. These various types of voids can occur in and around barrier films and metal contacts within the film stack. Such voids reduce the electrical conductivity of the film stack and can cause delamination issues. The methods described and discussed herein are used to at least reduce the size of the voids and/or completely eliminate the voids by exposing the film stacks to a high pressure, thermal oxidation process. During the oxidation process, an oxidizing gas is exposed to the inner surfaces of the voids to generate metal oxide that fills the voids while producing sealed seams within the film stack. Subsequently, in some examples, the film stack with the sealed seams is exposed to a high pressure, thermal process that includes an annealing gas.

Figure 1A:
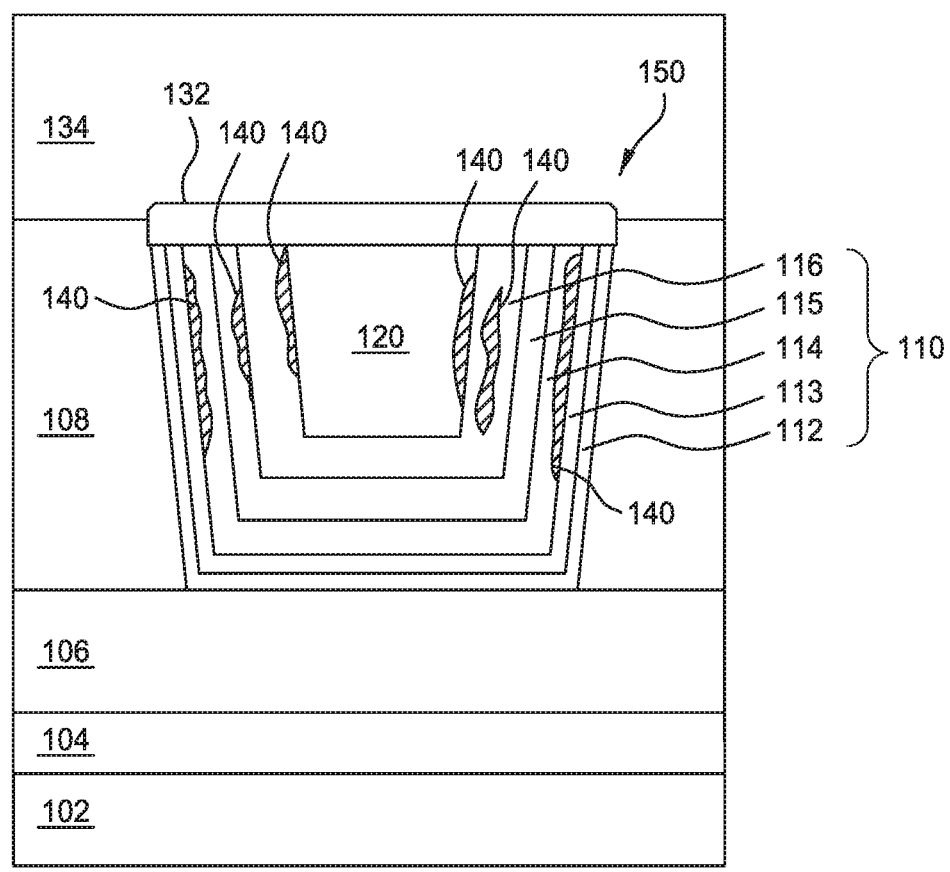
FIGS. 1A and 1B depict cross-sectional views of a film stack during various stages of fabrication, as discussed and described in one or more embodiments herein.

FIG. 1A depicts cross-sectional view of a film stack 100 containing a damascene structure 150 that includes one or more open seams, gaps, and/or voids 140 (six voids 140 are shown) therein, as discussed and described in one or more embodiments herein. The damascene structure 150 is a metal gate structure. The film stack 100 includes a substrate 102 containing dielectric layers 104 and 108 separated by an etch-stop layer 106 disposed therebetween. In one or more examples, the dielectric layer 104 can be or include silicon oxide or polysilicon and be disposed on the substrate 102, the etch-stop layer 106 can be or include silicon nitride, silicon carbide, or silicon carbide nitride and be disposed on the dielectric layer 104, and the dielectric layer 108 can be or include silicon oxide or polysilicon and be disposed on the etch-stop layer 106.

The damascene structure 150 is formed or otherwise produced within the dielectric layer 108 and on top of the etch-stop layer 106. The damascene structure 150 is a film stack and includes a barrier film 110 and a metal contact 120. The barrier film 110 can be or include one or more barrier layers 112, 113, 114, 115, and 116 which are each independently the same or different. Although the barrier film 110 is shown in FIG. 1A with five barrier layers (e.g., barrier layers 112, 113, 114, 115, and 116), the barrier film 110 can have one, two, three, four, five, six, or more barrier layers. As such, any of the barrier layers 112, 113, 114, 115, and 116 shown in FIG. 1A can be present or absent within the barrier film 110. The barrier film 110 is deposited, formed, or otherwise produced in one or more trenches or vias formed within the dielectric layer 108.

Each of the barrier layers 112, 113, 114, 115, and 116 can independently have a thickness of about 0.5 nm, about 1 nm, about 1.5 nm, about 2 nm, or about 2.5 nm to about 3 nm, about 4 nm, about 5 nm, about 8 nm, about 10 nm, or thicker. For example, each of the barrier layers 112, 113, 114, 115, and 116 can independently have a thickness of about 0.5 nm to about 10 nm, about 1 nm to about 10 nm, about 1.5 nm to about 10 nm, about 2 nm to about 10 nm, about 3 nm to about 10 nm, or about 5 nm to about 10 nm.

Each of the barrier layers 112, 113, 114, 115, and 116 can independently contain titanium, titanium nitride, titanium silicide nitride, titanium aluminum alloy, titanium aluminide, tantalum, tantalum nitride, tantalum silicide nitride, tungsten, tungsten nitride, tungsten silicide nitride, alloys thereof, or any combination thereof. In some examples, the barrier film 110 includes two or more different barrier layers and each of the barrier layers contains different compositions. In one or more examples, the barrier layer 112 contains titanium silicon nitride, the barrier layer 113 contains tantalum nitride, the barrier layer 114 contains titanium nitride, the barrier layer 115 contains titanium aluminum alloy (e.g., titanium aluminate), and the barrier layer 116 contains titanium nitride. Each of the barrier layers 112, 113, 114, 115, and 116 can independently be deposited, plated, formed, or otherwise prepared by chemical vapor deposition (CVD), plasma enhanced CVD (PE-CVD), atomic layer deposition (ALD), plasma enhanced ALD (PE-ALD), physical vapor deposition (PVD), or any combination thereof.

The metal contact 120 is deposited, formed, or otherwise produced on the upper layer (e.g., barrier layer 116) of the barrier film 110 so to fill the remaining trenches or vias formed within the dielectric layer 108. The metal contact 120 can be or include one or more metal seed layers, a bulk layer, a metal fill layer, or any combination thereof. In some examples, one or more metal seed layers are first deposited on the barrier film 110 and then a bulk or fill metal layer is deposited thereover filling the remaining trenches or vias.

The metal contact 120 can be or include one or more of tungsten, copper, aluminum, cobalt, ruthenium, palladium, alloys thereof, or any combination thereof. The metal contact 120 can be deposited, plated, formed, or otherwise prepared by chemical vapor deposition (CVD), plasma enhanced CVD (PE-CVD), atomic layer deposition (ALD), plasma enhanced ALD (PE-ALD), physical vapor deposition (PVD), electrochemical plating, electroless plating, or any combination thereof. In one or more embodiments, each of the layers within the barrier film 110 and the metal contact 120 can independently be deposited by the Trillium®, Producer®, or Centura® chamber, commercially available from Applied Materials, Inc.

The film stack 100 also includes a capping layer 132 disposed on or over the damascene structure 150 and an oxide layer 134 disposed on or over the capping layer 132 and the dielectric layer 108. The capping layer 132 can include a cobalt material, such as cobalt, cobalt phosphide, cobalt boride, cobalt phosphide boride, or combinations thereof and has a thickness of about 0.5 nm to about 5 nm. The oxide layer 134 can include silicon oxide or silicon oxynitride and has a thickness of about 50 nm to about 300 nm, such as about 100 nm to about 200 nm. In one or more examples, the capping layer 132 can be deposited by electroplating, electroless deposition, ALD, or CVD and the oxide layer 134 can be deposited by CVD or plasma enhanced-CVD.

The damascene structures 150, as well as the respective trenches or vias which the damascene structure 150 was formed within, have relatively high aspect ratios. The damascene structures 150 is depicted in FIG. 1A with a relatively low aspect ratio in order to easier illustrate all the various layers, films, and other features in the drawing. The damascene structures 150 generally have a much greater aspect ratio than illustrated in FIG. 1A. The damascene structures 150 can have an aspect ratio (depth over width) of greater than 1, such as about 2, about 3, about 5, about 8, or about 10 to about 12, about 15, about 20, about 30, about 40, about 50, about 60, about 80, or about 100. For example, the damascene structures 150 can have an aspect ratio of about 2 to about 100, about 2 to about 80, about 2 to about 60, about 2 to about 60, about 2 to about 50, about 2 to about 40, about 2 to about 35, about 2 to about 30, about 2 to about 20, about 10 to about 100, about 10 to about 80, about 10 to about 60, about 10 to about 60, about 10 to about 50, about 10 to about 40, about 10 to about 35, about 10 to about 30, or about 10 to about 20.

Open seams, gaps, and/or voids 140 can be inadvertently formed in the damascene structure 150 during the processes of depositing each of the different layers or films that make up the barrier film 110 and/or the metal contact 120. The term "voids"—as used herein—includes voids, open seams, gaps, and any other open or hollow defect contained within the damascene structure 150 including between layers and/or films. The voids 140 can be located between two of the barrier layers 112-116 contained within the barrier film 110, as well as located between the barrier film 110 and the metal contact 120. The voids 140 negatively affect the damascene structure 150 by decreasing the electrical resistivity due to the lack of conductive material from the barrier film 110 and/or the metal contact 120. The voids 140 can also increase the probability of failure due to delamination of the various layers within the damascene structure 150. Therefore, the methods described and discussed herein are used to at least reduce the size of the voids 140 and/or eliminate the voids 140.

In one or more embodiments, the method includes exposing at least the barrier film 110 to one or more oxidizing agents. The barrier film 110 can be exposed to the oxidizing agent before or after the deposition of the metal contact 120, before or after the deposition of the capping layer 132, and/or before or after the deposition of the oxide layer 134. In many examples discussed and described herein, the barrier film 110 is exposed to the oxidizing agent before or after the deposition of the metal contact 120.

In some embodiments, the method includes exposing the damascene structure 150, including the metal contact 120 and the barrier film 110, to one or more oxidizing agents. The oxidizing agent diffuses through holes within the barrier film 110 and/or the metal contact 120 to reach the voids 140. The oxidizing agent reacts with the metal and/or metal nitride within the barrier film 110 and/or the metal contact 120 to produce metal oxides within the voids 140. The voids 140 are at least partially filled, substantially filled, or completely filled with the metal oxide during the oxidation process. Since the metal oxide is derived from the barrier film 110 and/or the metal contact 120, the metal oxide includes one or more metals contained within the barrier film 110 and/or the metal contact 120. The oxidizing agent can be or include water, steam or water vapor, oxygen gas ($O_2$), oxygen plasma, ozone, hydrogen peroxide, or any combination thereof. The metal oxide can be or include one or more metal oxides and/or one or more metal oxynitrides, such as titanium oxide, tantalum oxide, tungsten oxide, titanium oxynitride, tantalum oxynitride, tungsten oxynitrides thereof, oxysilicides thereof, alloys thereof, or any combination thereof.

The damascene structure 150, including the metal contact 120 and the barrier film 110, is exposed to one or more oxidizing agents at a temperature of less than 400° C. and at a relatively high pressure (e.g., greater than 18 bar) to produce the metal oxide within the void 140. The relatively low temperature of less than 400° C. provides more flexible thermal limits to avoid damaging the damascene structure 150 or even the overall electronic device. The relatively high pressure during the process helps diffuse the reagents (e.g., oxidizing agents) into the voids 140. The metal contact 120 and the barrier film 110 are exposed to the oxidizing agent at the desired temperature and pressure for about 5 minutes, about 10 minutes, about 20 minutes, about 30 minutes, or about 45 minutes to about 1 hour, about 1.25 hours, about 1.5 hours, about 2 hours, about 2.5 hours, or about 3 hours.

The damascene structure 150, including the metal contact 120 and the barrier film 110, is exposed to the oxidizing agent at a temperature of less than 400° C., such as about 20° C., about 25° C., about 30° C., about 50° C., about 75° C., about 90° C., or about 100° C. to about 125° C., about 150° C., about 200° C., about 250° C., about 300° C., about 325° C., about 340° C., about 350° C., about 370° C., about 380° C., about 390° C., or 395° C. within the process chamber. For example, the damascene structure 150, including the metal contact 120 and the barrier film 110, is exposed to the oxidizing agent at a temperature of about 25° C. to about 390° C., about 25° C. to about 380° C., about 25° C. to about 350° C., about 25° C. to about 300° C., about 25° C. to about 275° C., about 25° C. to about 250° C., about 25° C. to about 200° C., about 25° C. to about 150° C., about 25° C. to about 125° C., about 25° C. to about 100° C., about 100° C. to about 390° C., about 100° C. to about 380° C., about 100° C. to about 350° C., about 100° C. to about 300° C., about 100° C. to about 275° C., about 100° C. to about 250° C., about 100° C. to about 200° C., about 100° C. to about 150° C., or about 100° C. to about 125° C.

The damascene structure 150, including the metal contact 120 and the barrier film 110, is exposed to the oxidizing agent at a pressure of greater than 18 bar, such as about 20 bar, about 25 bar, about 30 bar, or about 35 bar to about 40 bar, about 45 bar, about 50 bar, about 60 bar, about 70 bar, about 80 bar, about 90 bar, or about 100 bar within the process chamber. For example, the damascene structure 150, including the metal contact 120 and the barrier film 110, is exposed to the oxidizing agent at a pressure of about 20 bar to about 100 bar, about 20 bar to about 80 bar, about 20 bar to about 60 bar, about 20 bar to about 50 bar, about 20 bar to about 40 bar, about 25 bar to about 100 bar, about 25 bar to about 80 bar, about 25 bar to about 60 bar, about 20 bar to about 30 bar, about 30 bar to about 100 bar, about 30 bar to about 80 bar, about 30 bar to about 60 bar, about 30 bar to about 50 bar, or about 30 bar to about 40 bar.

In one or more examples, the metal contact 120 and the barrier film 110 are exposed to the oxidizing agent at a temperature of less than 400° C. and at a pressure of about 20 bar to about 100 bar within the process chamber to produce the metal oxide within the void 140. In some examples, the metal contact 120 and the barrier film 110 are exposed to the oxidizing agent at a temperature of about 25° C. to about 380° C. and at a pressure of about 25 bar to about 80 bar within the process chamber to produce the metal oxide within the void 140. In other examples, the metal contact 120 and the barrier film 110 are exposed to the oxidizing agent at a temperature of about 100° C. to about 350° C. and at a pressure of about 30 bar to about 60 bar within the process chamber to produce the metal oxide within the void 140.

Figure 1B:
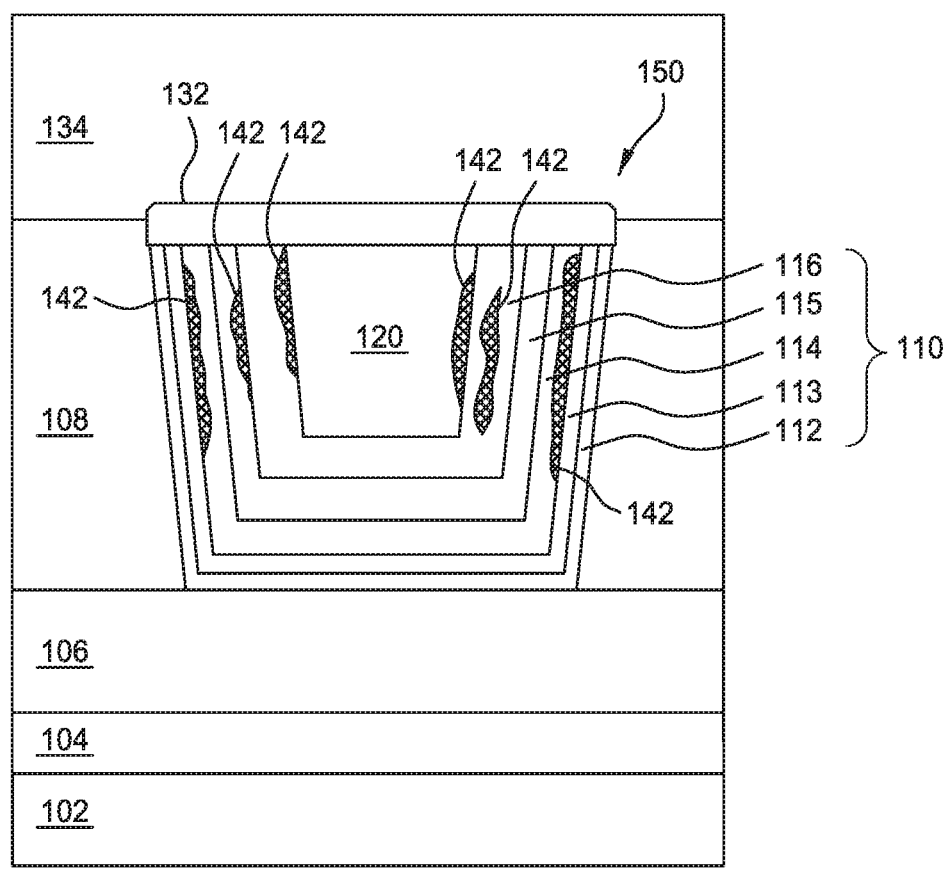

FIG. 1B depicts a cross-sectional view of the film stack 100 containing the damascene structure 150 in which the voids 140 (as depicted in FIG. 1A) have been at least partially filled and/or closed, if not completely filled and/or closed, with the metal oxide to produce sealed seams 142, as discussed and described in one or more embodiments herein. The formation of the metal oxide from the oxidized surfaces within the voids 140 leads to volume expansion which pushes the voids 140 to narrower until the voids at least partially filled and/or closed thereby producing the sealed seams 142.

Subsequent to the oxidation process described and discussed above, the substrate can be exposed to a post treatment process. The post treatment process can include further assist in forming the sealed seams 142 and also increases the electrical conductivity of the damascene structure 150. In some instances, the metal contact 120 and the barrier film 110 are exposed to reducing gas under relatively high pressure and low temperature. For example, the post treatment process can include exposing the metal contact 120 and the barrier film 110 to an annealing gas a temperature of less than 400° C. and at a pressure of about 20 bar to about 60 bar within the process chamber. The annealing gas can be or include nitrogen gas ($N_2$), ammonia, hydrazine, hydrogen gas ($H_2$), forming gas, or any combination thereof.

During the post treatment process, the damascene structure 150, including the metal contact 120 and the barrier film 110, is exposed to the annealing gas at a temperature of less than 400° C., such as about 20° C., about 25° C., about 30° C., about 50° C., about 75° C., about 90° C., or about 100° C. to about 125° C., about 150° C., about 200° C., about 250° C., about 300° C., about 325° C., about 340° C., about 350° C., about 370° C., about 380° C., about 390° C., or 395° C. within the process chamber. For example, the damascene structure 150, including the metal contact 120 and the barrier film 110, is exposed to the annealing gas at a temperature of about 25° C. to about 390° C., about 25° C. to about 380° C., about 25° C. to about 350° C., about 25° C. to about 300° C., about 25° C. to about 275° C., about 25° C. to about 250° C., about 25° C. to about 200° C., about 25° C. to about 150° C., about 25° C. to about 125° C., about 25° C. to about 100° C., about 100° C. to about 390° C., about 100° C. to about 380° C., about 100° C. to about 350° C., about 100° C. to about 300° C., about 100° C. to about 275° C., about 100° C. to about 250° C., about 100° C. to about 200° C., about 100° C. to about 150° C., or about 100° C. to about 125° C. during the post treatment process.

During the post treatment process, the damascene structure 150, including the metal contact 120 and the barrier film 110, is exposed to the annealing gas at a pressure of greater than 18 bar, such as about 20 bar, about 25 bar, about 30 bar, or about 35 bar to about 40 bar, about 45 bar, about 50 bar, about 60 bar, about 70 bar, about 80 bar, about 90 bar, or about 100 bar within the process chamber. For example, the damascene structure 150, including the metal contact 120 and the barrier film 110, is exposed to the annealing gas at a pressure of about 20 bar to about 100 bar, about 20 bar to about 80 bar, about 20 bar to about 60 bar, about 20 bar to about 50 bar, about 20 bar to about 40 bar, about 25 bar to about 100 bar, about 25 bar to about 80 bar, about 25 bar to about 60 bar, about 20 bar to about 30 bar, about 30 bar to about 100 bar, about 30 bar to about 80 bar, about 30 bar to about 60 bar, about 30 bar to about 50 bar, or about 30 bar to about 40 bar during the post treatment process.

The damascene structure 150 with the voids 140 containing metal oxides and/or the sealed seams 142 is exposed to the annealing gas at the desired temperature and pressure during the post treatment process for about 1 minute, about 2 minutes, about 5 minutes, about 10 minutes, about 20 minutes, about 30 minutes, or about 45 minutes to about 1 hour, about 1.25 hours, about 1.5 hours, about 2 hours, about 2.5 hours, or about 3 hours.

The oxidation process and/or the post treatment process can be conducted in the same process or deposition chamber as any of the deposition processes (e.g., the barrier film 110 and/or the metal contact 120) or in different process chambers. In some examples, the oxidation process and/or the post treatment process can independently be conducted in a high pressure anneal or thermal process chamber or system. For example, the oxidation process and/or the post treatment process can independently be conducted in a pressurized annealing chamber, such as the Centura®, Radiance®, or WXZ™ chambers or systems, commercially available from Applied Materials, Inc.

In one or more embodiments, a method of treating a film stack 100 includes depositing a barrier film 110 containing one or more metals and/or metal nitrides into one or more trenches or vias formed within a dielectric layer 108 disposed on a substrate 102 and depositing a metal contact 120 on the barrier film 110 within the vias, where one or more voids 140 are located within the barrier film 110 or between the barrier film 110 and the metal contact 120. The method also includes exposing the metal contact 120 and the barrier film 110 to an oxidizing agent at a temperature of less than 400° C. and at a pressure of about 20 bar to about 100 bar within a process chamber to produce a metal oxide within the voids 140.

In some embodiments, a method of treating a film stack 100 includes depositing a barrier film 110 containing one or more metals and/or metal nitrides into one or more trenches or vias located on a substrate 102 and depositing a metal contact 120 on the barrier film 110 within the vias, where one or more voids 140 are located within the barrier film 110 or between the barrier film 110 and the metal contact 120. The method also includes exposing the metal contact 120 and the barrier film 110 to an oxidizing agent at a temperature of less than 400° C. and at a pressure of about 20 bar to about 100 bar within a process chamber to produce a metal oxide within the voids 140, and then exposing the metal contact 120 and the barrier film 110 to an annealing gas a temperature of less than 400° C. and at a pressure of about 20 bar to about 100 bar within the process chamber, where the annealing gas can be or include nitrogen gas ($N_2$), ammonia, hydrogen gas ($H_2$), or a mixture thereof. In some examples, the voids 140 are disposed between two layers contained in the barrier film 110.

In other embodiments, a method of treating a film stack 100 includes depositing a barrier film 110 containing one or more metals and/or metal nitrides into one or more trenches or vias formed within a dielectric layer 108 disposed on a substrate 102, where the voids 140 are disposed within the barrier film 110. The method also includes exposing the barrier film 110 to an oxidizing agent at a temperature of less than 400° C. and at a pressure of about 20 bar to about 100 bar within a process chamber to produce a metal oxide within the voids 140. The oxidizing agent can be or include water, steam, oxygen gas ($O_2$), oxygen plasma, ozone, hydrogen peroxide, or any combination thereof. The method further includes filling the voids 140 with the metal oxide to produce a sealed seam 142 within the film stack 100.

In other embodiments, a method of treating a film stack 100 includes depositing a barrier film 110 containing one or more metals and/or metal nitrides into one or more trenches or vias formed within a dielectric layer 108 disposed on a substrate 102 and depositing a metal contact 120 on the barrier film 110 within the vias, where the voids 140 are disposed within the barrier film 110 or between the barrier film 110 and the metal contact 120. The method also includes exposing the metal contact 120 and the barrier film 110 to an oxidizing agent at a temperature of less than 400° C. and at a pressure of about 20 bar to about 100 bar within a process chamber to produce a metal oxide within the voids 140. The oxidizing agent can be or include water, steam, oxygen gas ($O_2$), oxygen plasma, ozone, hydrogen peroxide, or any combination thereof. The method further includes filling the voids 140 with the metal oxide to produce a sealed seam 142 within the film stack 100.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of treating a film stack, comprising:
   depositing a barrier film comprising a metal into a via formed within a dielectric layer disposed on a substrate;
   depositing a metal contact on the barrier film within the via, wherein a void is located between two barrier layers contained within the barrier film; and
   exposing the metal contact and the barrier film to an oxidizing agent at a temperature of less than 400° C. and at a pressure of about 20 bar to about 100 bar within a process chamber to produce a metal oxide within the void.

2. The method of claim 1, wherein the oxidizing agent diffuses through holes within the barrier film to reach the void.

3. The method of claim 1, wherein the void is filled with the metal oxide to produce a sealed seam.

4. The method of claim 1, wherein the metal oxide comprises the metal contained in the barrier film.

5. The method of claim 4, wherein the metal oxide comprises titanium oxide, tantalum oxide, tungsten oxide, titanium oxynitride, tantalum oxynitride, tungsten oxynitride, alloys thereof, or any combination thereof.

6. The method of claim 1, wherein the temperature of the process chamber is about 25° C. to about 380° C. when the metal contact and the barrier film are exposed to the oxidizing agent.

7. The method of claim 1, wherein the temperature of the process chamber is about 100° C. to about 350° C. when the metal contact and the barrier film are exposed to the oxidizing agent.

8. The method of claim 1, wherein the pressure of the process chamber is about 25 bar to about 80 bar when the metal contact and the barrier film are exposed to the oxidizing agent.

9. The method of claim 8, wherein the pressure of the process chamber is about 30 bar to about 60 bar.

10. The method of claim 1, wherein the oxidizing agent comprises water, steam, oxygen gas ($O_2$), oxygen plasma, ozone, hydrogen peroxide, or any combination thereof.

11. The method of claim 1, wherein the barrier film comprises one layer of titanium, titanium nitride, titanium silicide nitride, titanium aluminum alloy, titanium aluminide, tantalum, tantalum nitride, tantalum silicide nitride, tungsten, tungsten nitride, tungsten silicide nitride, alloys thereof, or any combination thereof.

12. The method of claim 1, wherein the metal contact comprises tungsten, copper, cobalt, alloys thereof, or any combination thereof.

13. The method of claim 1, wherein a damascene structure comprising the barrier film and the metal contact has an aspect ratio of about 2 to about 100.

14. A method of treating a film stack, comprising:
    depositing a barrier film comprising a metal into a via located on a substrate;
    depositing a metal contact on the barrier film within the via, wherein a void is located within the barrier film or between the barrier film and the metal contact;
    exposing the metal contact and the barrier film to an oxidizing agent at a temperature of less than 400° C. and at a pressure of about 20 bar to about 100 bar within a process chamber to produce a metal oxide within the void; and then
    exposing the metal contact and the barrier film to an annealing gas a temperature of less than 400° C. and at a pressure of about 20 bar to about 100 bar within the process chamber, wherein the annealing gas comprises nitrogen gas ($N_2$), ammonia, hydrogen gas ($H_2$), or a mixture thereof.

15. The method of claim 14, wherein the temperature of the process chamber is about 25° C. to about 380° C. and at a pressure of about 25 bar to about 80 bar when the metal contact and the barrier film are exposed to the oxidizing agent.

16. The method of claim 14, wherein the temperature of the process chamber is about 100° C. to about 350° C. and at a pressure of about 30 bar to about 60 bar when the metal contact and the barrier film are exposed to the oxidizing agent.

17. A method of treating a film stack, comprising:
    depositing a barrier film comprising a metal into a via formed within a dielectric layer disposed on a substrate;
    depositing a metal contact on the barrier film within the via, wherein a void is located within the barrier film or between the barrier film and the metal contact; and
    exposing the metal contact and the barrier film to an oxidizing agent at a temperature of less than 400° C. and at a pressure of about 20 bar to about 100 bar within a process chamber to produce a metal oxide within the void; and then
    exposing the metal contact and the barrier film to an annealing gas at a temperature of less than 400° C. and at a pressure of about 20 bar to about 60 bar within the process chamber, wherein the annealing gas comprises nitrogen gas ($N_2$), ammonia, hydrazine, hydrogen gas ($H_2$), forming gas, or any combination thereof.

18. The method of claim 17, wherein the metal oxide comprises the metal contained in the barrier film.

19. The method of claim 18, wherein the metal oxide comprises titanium oxide, tantalum oxide, tungsten oxide, titanium oxynitride, tantalum oxynitride, tungsten oxynitride, alloys thereof, or any combination thereof.

20. The method of claim 17, wherein the temperature of the process chamber is about 100° C. to about 350° C. when the metal contact and the barrier film are exposed to the oxidizing agent.

* * * * *